United States Patent
Jeong et al.

(10) Patent No.: US 10,468,547 B2
(45) Date of Patent: Nov. 5, 2019

(54) SILICON WAFER HAVING COMPLEX STRUCTURE, FABRICATION METHOD THEREFOR AND SOLAR CELL USING SAME

(71) Applicant: KOREA INSTITUTE OF INDUSTRIAL TECHNOLOGY, Cheonan-si, Chungcheongnam-do (KR)

(72) Inventors: Chae Hwan Jeong, Gwangju (KR); Jong Hwan Lee, Daejeon (KR); Ho Sung Kim, Gwangju (KR); Chang Heon Kim, Gwangju (KR)

(73) Assignee: KOREA INSTITUTE OF INDUSTRIAL TECHNOLOGY, Chungcheongnam-Do (KR)

(*) Notice: Subject to any disclaimer, the term of this patent is extended or adjusted under 35 U.S.C. 154(b) by 487 days.

(21) Appl. No.: 14/906,764

(22) PCT Filed: Dec. 20, 2013

(86) PCT No.: PCT/KR2013/011930
§ 371 (c)(1),
(2) Date: Jan. 21, 2016

(87) PCT Pub. No.: WO2015/012457
PCT Pub. Date: Jan. 29, 2015

(65) Prior Publication Data
US 2016/0181455 A1   Jun. 23, 2016

(30) Foreign Application Priority Data

Jul. 25, 2013  (KR) .................. 10-2013-0088001
Jul. 25, 2013  (KR) .................. 10-2013-0088015

(51) Int. Cl.
*H01L 31/18*   (2006.01)
*H01L 31/068*  (2012.01)
(Continued)

(52) U.S. Cl.
CPC .......... *H01L 31/068* (2013.01); *H01L 31/028* (2013.01); *H01L 31/02363* (2013.01);
(Continued)

(58) Field of Classification Search
CPC ....... H01L 31/02363; H01L 31/035227; H01L 31/1804; H01L 31/186; H01L 31/028; H01L 31/035281; H01L 31/068
See application file for complete search history.

(56) References Cited

U.S. PATENT DOCUMENTS 3,895,975 A * 7/1975 Lindmayer ............ C30B 31/06
                                                      438/89
4,468,853 A * 9/1984 Morita .................. H01L 31/202
                                                      136/256
(Continued)

FOREIGN PATENT DOCUMENTS

JP   2002-151716 A   5/2002
JP   2010-062302 A   3/2010
(Continued)

OTHER PUBLICATIONS

International Search Report of PCT/KR2013/011930 dated May 14, 2014.
(Continued)

*Primary Examiner* — Golam Mowla
(74) *Attorney, Agent, or Firm* — Cantor Colburn LLP

(57) ABSTRACT

Disclosed are a silicon wafer having a complex structure, a method of fabricating the same, and a solar cell using the same, wherein the silicon wafer is configured such that an oriented silicon wafer has a pyramid pattern formed through wet etching and additionally has nanowires formed in the direction in which silicon crystals are oriented on the pyramid pattern, and is further doped with POCl$_3$.

8 Claims, 7 Drawing Sheets

(51) Int. Cl.
H01L 31/0236 (2006.01)
H01L 31/0352 (2006.01)
H01L 31/028 (2006.01)

(52) U.S. Cl.
CPC ........ H01L 31/035227 (2013.01); H01L 31/035281 (2013.01); H01L 31/1804 (2013.01); H01L 31/186 (2013.01); *Y02E 10/547* (2013.01); *Y02P 70/521* (2015.11)

(56) References Cited

U.S. PATENT DOCUMENTS

| | | | |
|---|---|---|---|
| 2002/0079290 A1* | 6/2002 | Holdermann | H01L 31/0236 216/99 |
| 2006/0207647 A1* | 9/2006 | Tsakalakos | B82Y 20/00 136/256 |
| 2009/0286347 A1 | 11/2009 | Kim et al. | |
| 2010/0267186 A1* | 10/2010 | Wang | H01L 31/035281 438/71 |
| 2011/0309323 A1* | 12/2011 | Myoung | B82Y 10/00 257/9 |
| 2012/0318342 A1 | 12/2012 | Dimitrakopoulos et al. | |
| 2013/0109128 A1* | 5/2013 | Katsura | H01L 31/02363 438/71 |
| 2013/0288418 A1* | 10/2013 | Wang | H01L 31/186 438/68 |

FOREIGN PATENT DOCUMENTS

| | | |
|---|---|---|
| KR | 10-2009-0077274 A | 7/2009 |
| KR | 10-2012-0054828 A | 5/2012 |
| KR | 10-2013-0079828 A | 7/2013 |

OTHER PUBLICATIONS

Communication dated Sep. 30, 2014, issued by the Korean Intellectual Property Office in corresponding Korean Application No. 10-2013-0088001.

Communication dated Apr. 1, 2015, issued by the Korean Intellectual Property Office in corresponding Korean Application No. 10-2013-0088001.

Communication dated Sep. 30, 2014, issued by the Korean Intellectual Property Office in corresponding Korean Application No. 10-2013-0088015.

Communication dated Apr. 2, 2015, issued by the Korean Intellectual Property Office in corresponding Korean Application No. 10-2013-0088015.

In-Ji Lee et al., "Solar cell implemented with silicon nanowires on pyramid-texture silicon surface", Solar Energy 91 (2013) pp. 256-262.

* cited by examiner

SILICON WAFER HAVING COMPLEX STRUCTURE, FABRICATION METHOD THEREFOR AND SOLAR CELL USING SAME

CROSS REFERENCE TO RELATED APPLICATIONS

This is a National Stage of International Application No. PCT/KR2013/011930 filed Dec. 20, 2013, claiming priority based on Korean Patent Application Nos. 10-2013-0088001 filed Jul. 25, 2013 and 10-2013-0088015 filed Jul. 25, 2013, the contents of all of which are incorporated herein by reference.

TECHNICAL FIELD

The present invention relates to a silicon wafer for a solar cell and, more particularly, to a silicon wafer configured such that monocrystalline silicon is subjected to a wet etching process to form a pattern, a method of fabricating the same, and a solar cell using the same.

BACKGROUND ART

With the current increase in greenhouse gas emission reduction obligations through conventions on climate change, carbon dioxide markets have become activated, and thus new renewable energy is receiving attention.

Examples of new renewable energy may include solar light, wind power, biomass, geothermal power, water power, tidal power, etc. In particular, a solar cell is a system for producing electricity using solar light, which is an infinite clean energy source, the rapid growth of which is expected, and such a solar cell functions to directly convert light into electricity.

Also, solar cells are the only power source that decreases power generation costs, and adopt the energy that obviates the construction of power plants, incurs only maintenance costs, and is safe and environmentally friendly, unlike nuclear energy.

A variety of kinds of solar cells are provided, which include typical crystalline solar cells, CIGS as thin-film-type solar cells, and DSSC as next-generation solar cells.

A silicon thin-film solar cell includes an amorphous silicon (a-Si:H) solar cell, which was first developed and distributed, and a microcrystalline silicon (μc-Si:H) solar cell for increasing light absorption efficiency. Furthermore, the silicon thin-film solar cell may be exemplified by a silicon thin-film solar cell having a tandem structure (a-Si:H/c-Si:H) resulting from layering two solar cells having different band gaps.

In particular, a crystalline solar cell is advantageous in terms of high efficiency. In order to further increase the efficiency of the crystalline solar cell, the surface thereof is textured in a manner in which the flat surface of a silicon wafer is roughened through dry etching or wet etching to thus reduce the reflectance thereof.

Korean Patent Application Publication No. 2013-0043051 discloses an etchant composition for texturing a crystalline silicon wafer and an etching process for texturing, especially an etchant composition for texturing a crystalline silicon wafer and an etching process for texturing in which a specific pyramid structure is formed so as to reduce reflectance. Although this patent may reduce reflectance, the reduction is not significant.

Thus, a silicon wafer and a solar cell using the same are required, in which reflectance may be significantly decreased when the silicon wafer is utilized in the solar cell, and the carrier lifetime may be improved.

DISCLOSURE

Technical Problem

Accordingly, the present invention has been made keeping in mind the above problems occurring in the related art, and an object of the present invention is to provide a method of fabricating a silicon wafer which adopts a wet etching process and in which the structure of the silicon wafer may be controlled by adjusting the composition and processing time.

Another object of the present invention is to provide a silicon wafer having a long carrier lifetime.

Still another object of the present invention is to provide a silicon wafer that exhibits low incident light reflectance compared to a flat panel-type structure and a typical pyramid structure, making it suitable to apply to the fabrication of a high-efficiency solar cell.

Technical Solution

In order to accomplish the above objects, the present invention provides a silicon wafer having a complex structure, configured such that an oriented silicon wafer has a pyramid pattern formed through wet etching and has nanowires formed in a silicon crystal orientation direction on the pyramid pattern.

Also, the silicon wafer, which has the nanowires, may be doped with $POCl_3$.

Also, the wet etching may be performed at 70 to 80° C. using an etchant comprising 1 to 3 wt % of NaOH, 4 to 8 wt % of an organic solvent, and 90 to 95 wt % of deionized (DI) water.

Furthermore, the organic solvent may comprise at least one selected from the group consisting of isopropyl alcohol, ethyl alcohol, methyl alcohol, and acetone.

Also, the nanowires may be formed on the pyramid pattern through oxidative etching by immersing the silicon wafer having the pyramid pattern in a solution comprising hydrofluoric acid (HF), DI water, hydrogen peroxide ($H_2O_2$) and $AgNO_3$, in which a mixing ratio of DI water to HF is a volume ratio of 8:1 to 10:1, a mixing ratio of hydrogen peroxide ($H_2O_2$) to HF is a molar ratio of 1:6 to 1:10, and a mixing ratio of $AgNO_3$ to HF is a molar ratio of 1:300 to 1:500.

In addition, the present invention provides a method of fabricating a silicon wafer having a complex structure, comprising: preparing an oriented silicon wafer; forming a pyramid pattern on a surface of the silicon wafer through wet etching; and forming nanowires by oxidizing the surface of the silicon wafer having the pyramid pattern formed through wet etching.

Also, the method may further comprise doping the silicon wafer with $POCl_3$, after the forming the nanowires.

Also, the wet etching may be performed at 70 to 80° C. using an etchant comprising 1 to 3 wt % of NaOH, 4 to 8 wt % of an organic solvent, and 90 to 95 wt % of DI water.

Also, the organic solvent may comprise at least one selected from the group consisting of isopropyl alcohol, ethyl alcohol, methyl alcohol, and acetone.

Also, the nanowires may be formed on the pyramid pattern through oxidative etching by immersing the silicon wafer having the pyramid pattern in a solution comprising hydrofluoric acid (HF), DI water, hydrogen peroxide ($H_2O_2$) and $AgNO_3$, in which a mixing ratio of DI water to HF is a volume ratio of 8:1 to 10:1, a mixing ratio of hydrogen peroxide ($H_2O_2$) to HF is a molar ratio of 1:6 to 1:10, and a mixing ratio of $AgNO_3$ to HF is a molar ratio of 1:300 to 1:500.

Furthermore, the immersing may be performed for a period of time ranging from 45 to 90 sec.

In addition, the present invention provides a solar cell manufactured using the above silicon wafer having a complex structure or the above method.

Also, the sheet resistance in the solar cell may be 50 to 60 Ω/sq.

Also, the carrier lifetime in the solar cell may be 47 to 55 µs.

Advantageous Effects

According to the present invention, a silicon wafer having a complex structure and a solar cell using the same can be remarkably improved in terms of carrier lifetime.

Also, according to the present invention, the silicon wafer having a complex structure can exhibit notably low incident light reflectance compared to that of a flat panel-type structure and a typical pyramid (textured) structure, and is thus appropriate for use in the fabrication of a high-efficiency solar cell.

Also, according to the present invention, the silicon wafer having a complex structure and the solar cell using the same can have a long carrier lifetime.

According to the present invention, in the fabrication of the solar cell, the silicon wafer having a complex structure can be uniformly doped with $POCl_3$, thus increasing the light path to thereby contribute to an increase in the current value due to the generation of a quantum effect such as photon confinement, compared to conventional texturing doping.

BEST MODE

Figure 1:
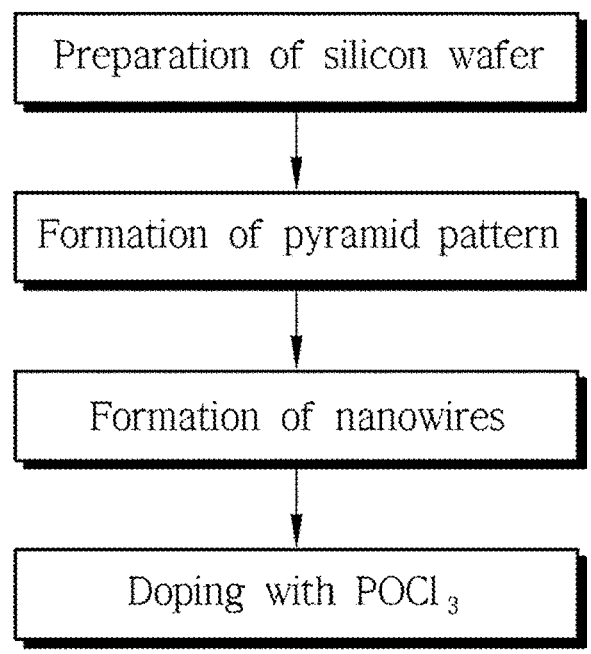
FIG. 1 is a flowchart illustrating the process of fabricating a silicon wafer having a complex structure according to an embodiment of the present invention.

Hereinafter, a detailed description will be given of preferred embodiments of the present invention through the appended drawings. Throughout the drawings, the same reference numerals refer to the same or like elements or parts. In the following description of the present invention, detailed descriptions of known constructions and functions incorporated herein will be omitted when they may make the gist of the present invention unclear.

It will be understood that when a particular allowable error in manufacturing and materials is presented in meaning, the terms "about" and "substantially" are used to mean a numerical value or a proximate value to the numerical value. The terms are also used to help the understanding of the present invention and to prevent the unfair use of the disclosure mentioning an accurate or absolute numeral value.

The present invention addresses a silicon wafer having a complex structure, a method of fabricating the same, and a solar cell using the same, wherein the silicon wafer is configured such that an oriented silicon wafer has a pyramid pattern formed through wet etching and additionally has nanowires formed along the silicon crystal orientation direction on the pyramid pattern, and is further doped with $POCl_3$.

FIG. 1 illustrates the process of fabricating the silicon wafer having a complex structure according to an embodiment of the present invention.

According to the present invention, the method of fabricating the silicon wafer having a complex structure comprises (1) preparing an oriented silicon wafer, (2) forming a pyramid pattern on the surface of the silicon wafer through wet etching, and (3) forming nanowires by oxidizing the surface of the silicon wafer having the pyramid pattern formed through wet etching, and further comprises (4) doping the silicon wafer with $POCl_3$.

Specifically, in the preparation of the oriented silicon wafer, a single-oriented monocrystalline silicon wafer is prepared.

In an embodiment of the invention, a (100)-oriented silicon wafer is prepared, but the present invention is not limited thereto.

Also, cleaning the surface of the silicon wafer to be etched using a cleaner solution may be further performed. In particular, the cleaning functions to remove an oxide film and pollutants from the surface of the silicon wafer.

In an embodiment of the present invention, an EKC-830 solution may be used as the cleaner solution. Before wet etching, the surface of the wafer may be cleaned for about 10 min using EKC-830 to remove the oxide film therefrom. The cleaner solution used in the present embodiment is not limited thereto, and may include, for example, BOE, HF, etc., suitable for use in etching.

Next, wet etching is performed on the surface of the oriented silicon wafer, thus forming the pyramid pattern.

The wet etching may be carried out using an alkaline etchant. The wet etchant is composed of 1 to 3 wt % of NaOH, 4 to 8 wt % of an organic solvent, and 90 to 95 wt % of deionized (DI) water, and the reaction temperature preferably falls in the range of 70 to 80° C.

The organic solvent preferably includes at least one selected from the group consisting of isopropyl alcohol, ethyl alcohol, methyl alcohol, and acetone. Particularly useful is isopropyl alcohol.

The wet etching is carried out through the following scheme (1).

$$Si + 4OH^- + 4H^+ \rightarrow Si(OH)_4 + 2H_2 \quad (1)$$

As shown in the scheme (1), hydrogen is generated as a byproduct in the wet etching using alkaline NaOH. When hydrogen is attached in the form of a bubble to the surface of the silicon wafer, the etchant is prevented from coming into contact with the silicon wafer, undesirably causing non-uniform etching. Hence, the temperature of the etchant has to be maintained high in order to discourage the attachment of bubbles to the surface of the silicon wafer.

Thus, the etchant is used at a high temperature, preferably 70 to 80° C., taking into consideration 82.4° C., which is the boiling point of isopropyl alcohol.

Furthermore, the wet etching is preferably performed for 13 to 17 min, and more preferably 15 min. When the wet etching time falls in the above range, the pyramid shape is formed as desired. If the wet etching time exceeds the upper limit, etching is excessively caused, undesirably breaking the structure. On the other hand, if the wet etching time is less than the lower limit, insufficient etching may occur, making it difficult to form the structure.

In lieu of dry etching, which is expensive and requires a long processing time, wet etching, which is inexpensive and requires only a short processing time, is used in the fabrication of a solar cell. Specifically, conventional dry etching devices, for example, an ICP (Induced Coupled Plasma) device and a RIE (Reactive Ion Etching) device, must be used in a vacuum, and are thus expensive. Furthermore, since such devices must be operated in a clean room, excessive maintenance costs are required. In the present invention, however, typical wet etching is adopted, thereby inexpensively fabricating a solar cell.

Through the wet etching described above, a pyramid pattern may be formed on the surface of the silicon wafer.

Figure 2:
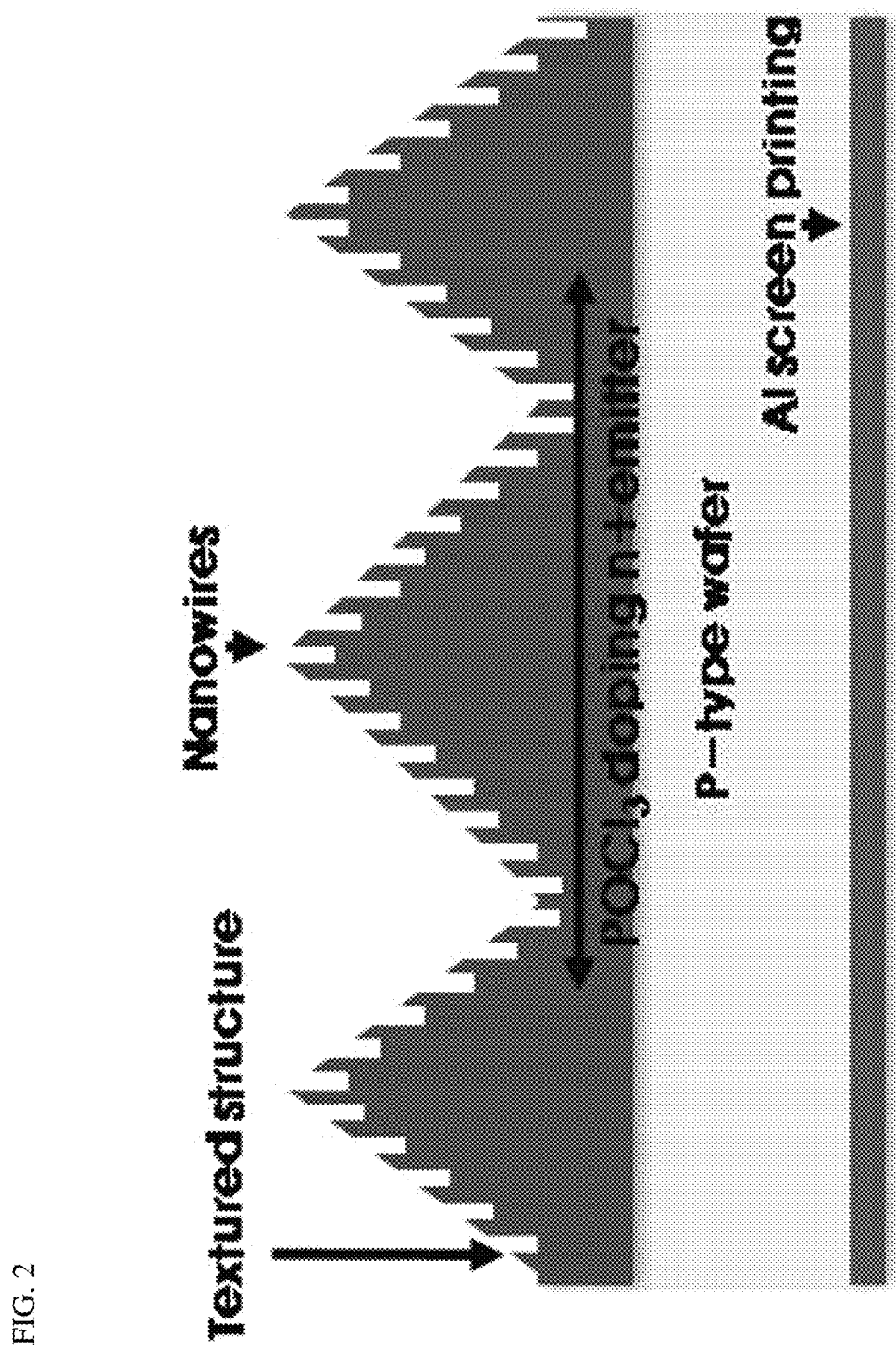
FIG. 2 is a schematic cross-sectional view illustrating the silicon wafer having a complex structure according to an embodiment of the present invention.
Figure 3:
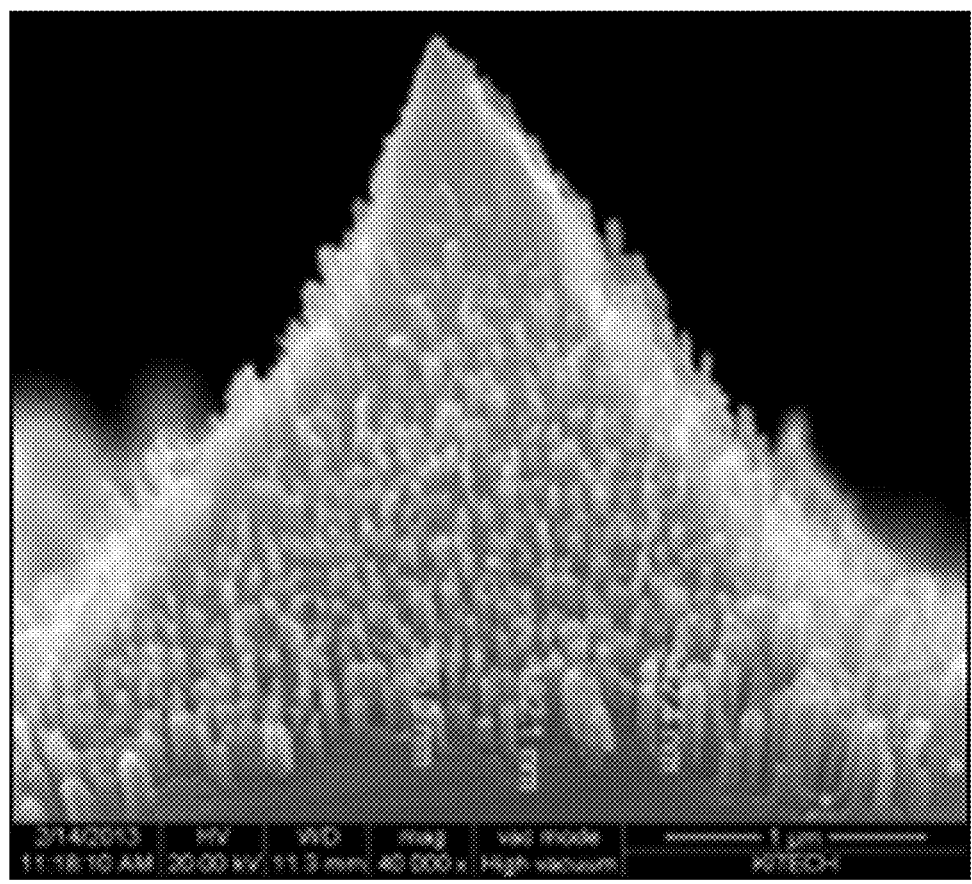
FIG. 3 is a scanning electron microscope (SEM) image illustrating the silicon wafer having a complex structure according to an embodiment of the present invention.

FIG. 2 is a schematic cross-sectional view illustrating the silicon wafer having a complex structure according to an embodiment of the present invention, and FIG. 3 is an SEM image illustrating the silicon wafer having a complex structure according to an embodiment of the present invention.

The nanowires may be formed on the pyramid pattern through oxidative etching, which is regarded as a wet etching process. Accordingly, the nanowires are formed on the pyramid pattern by the etching reaction.

The solution for forming nanowires through the oxidative etching reaction may include, for example, a solution obtained by dispersing $AgNO_3$ in a mixed solution comprising hydrofluoric acid (HF), DI water and hydrogen peroxide ($H_2O_2$). The mixing ratio of DI water to HF may be a volume ratio of 8:1 to 10:1, the mixing ratio of hydrogen peroxide ($H_2O_2$) to HF may be a molar ratio of 1:6 to 1:10, and the mixing ratio of $AgNO_3$ to HF may be a molar ratio of 1:300 to 1:500.

The silicon wafer having the pyramid pattern is immersed in the solution for forming nanowires, obtained by dispersing $AgNO_3$ in HF diluted with DI water, whereby Ag nanoparticles are oxidized on the interface of silicon to thus cause etching, ultimately forming the nanowires.

The immersion time of the silicon wafer in the solution for forming nanowires preferably falls in the range of 40 to 200 sec. Given the above immersion time range, the nanowires may be appropriately formed.

If the immersion time is less than the above lower limit, it is difficult to form the nanowires. On the other hand, if the immersion time exceeds the above upper limit, the nanowire structure may be broken.

After the formation of the pyramid pattern, wet etching is repeated to form nanowires, resulting in a complex structure. The resulting solar cell may exhibit quite low incident light reflectance and high efficiency compared to conventional flat panel-type structures. In the present invention, the light-absorbing layer, which is typically flat, is provided in a complex structure through wet etching, whereby the path of incident light is increased, and thus the current value may be increased due to the generation of a quantum effect such as photon confinement, thereby obtaining a solar cell having increased efficiency.

Meanwhile, the nanowires are formed through etching in the silicon crystal orientation direction. This is because anisotropic etching is caused due to the crystallinity of silicon crystals and thus the etching rate is much faster in the crystal orientation direction than in the non-crystal orientation direction. Briefly, the nanowires are formed in the direction in which the silicon crystals are oriented. In an embodiment of the present invention as shown in FIG. 3, the nanowires are formed in the (100) silicon crystal orientation direction, and are thereby formed perpendicular to the silicon wafer.

Next, the silicon wafer is doped with $POCl_3$.

In the doping step, when an n-type dopant such as $POCl_3$ is supplied, phosphorus (P) is diffused on the surface of the silicon wafer having a complex structure, thus forming an emitter layer.

A typical doping process may be exemplified by SOD (Spin-On Doping), implantation doping, laser doping, etc. Specifically, SOD is performed in a manner in which a doping material is deposited on the surface of a wafer and uniformly applied using spin coating, but makes it impossible to realize uniform doping when used for a patterned (textured) wafer. Also, implantation doping is advantageous because an emitter is selectively formed by adjusting the dose of a doping material to thus enable the fabrication of a high-efficiency solar cell, but is unsuitable for mass production because a device therefor is expensive. Also, laser doping is advantageous because the junction depth and surface concentration may be easily controlled as desired by adjusting the frequency and intensity of a laser, but is problematic in that defects formed on the surface of the wafer due to laser processing must be removed.

In the present invention, the surface of the wafer having a complex structure is not uniform, but may be uniformly doped with $POCl_3$ to form an emitter layer. Hence, the doping process using $POCl_3$ according to the present invention may increase the light path to thus contribute to an increase in the current value due to the generation of a quantum effect such as photon confinement, compared to the other doping processes.

Furthermore, doping with $POCl_3$ is preferably performed at 855 to 865° C., and more preferably 860° C. Also, the sheet resistance preferably falls in the range of 50 to 60 Ω/sq.

The average sheet resistance is 52.79889 at 860° C. and is thus very close to the sheet resistance of a currently commercially available product. On the other hand, the lowest sheet resistance of 44.22111 is shown at 880° C., in which low sheet resistance means that the amount of impurities is large. Accordingly, the amount of leakage current may be increased, and thus the doping process at 880° C. is regarded as inappropriate. The doping process at 860° C., which represents the sheet resistance very close to that of a commercially available product, is the most appropriate.

Figure 4:
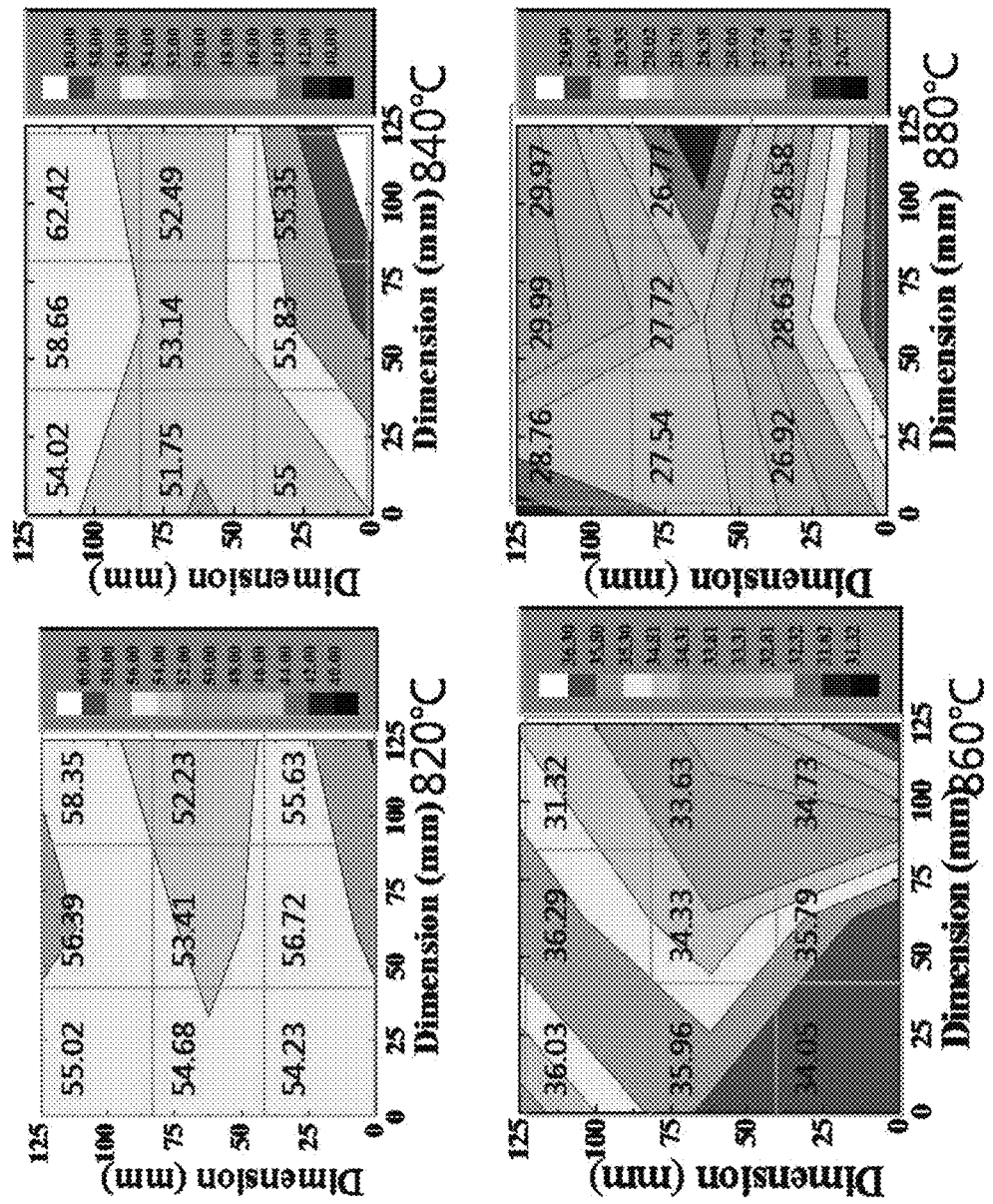
FIG. 4 illustrates sheet resistance depending on the doping temperature.
Figure 5:
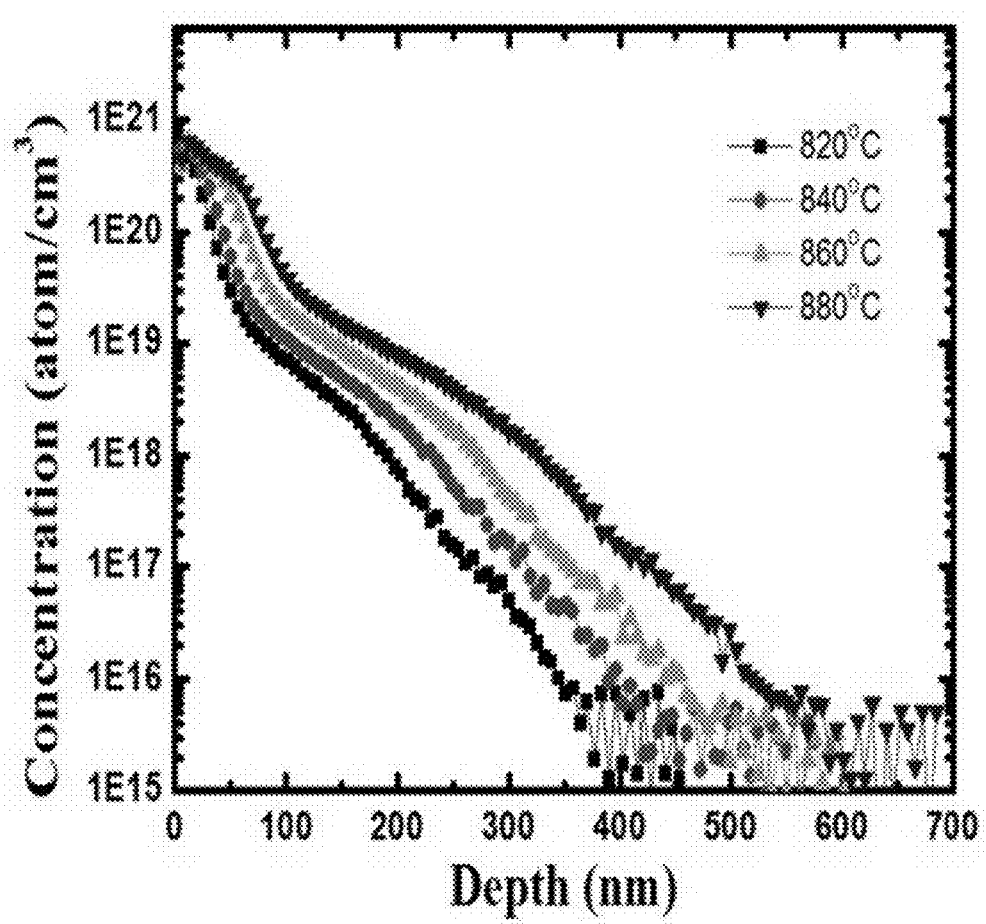
FIG. 5 is a graph illustrating the SIMS profile depending on the doping temperature.

FIG. 4 illustrates the sheet resistance depending on the doping temperature, and FIG. 5 illustrates the SIMS profile graph depending on the doping temperature.

The atomic concentration depending on the doping depth after doping with the second dopant using $POCl_3$ is measured at different doping temperatures. This process is performed through SIMS profile, resulting in an optimal p-n junction depth for microwires.

As illustrated in FIG. 4, the atomic concentration depending on the doping depth after doping with the second dopant using POCl$_3$ is proportional to the temperature, and is decreased with an increase in the doping depth. Furthermore, the optimal p-n junction depth for microwires is determined to be 0.5 m based on the values measured at 860° C. that is the optimal temperature.

The additional processes, which are performed to manufacture the solar cell, include removing PSG (Phospho silicate glass), forming electrodes and the like, which are typically disclosed in the art, and thus a detailed description thereof is omitted.

Meanwhile, the carrier lifetime in the solar cell fabricated in the present invention may be in the range of 47 to 55 μs.

As described above, the silicon wafer having a complex structure has very low reflectance, thus enabling the fabrication of a high-efficiency solar cell.

Figure 6:
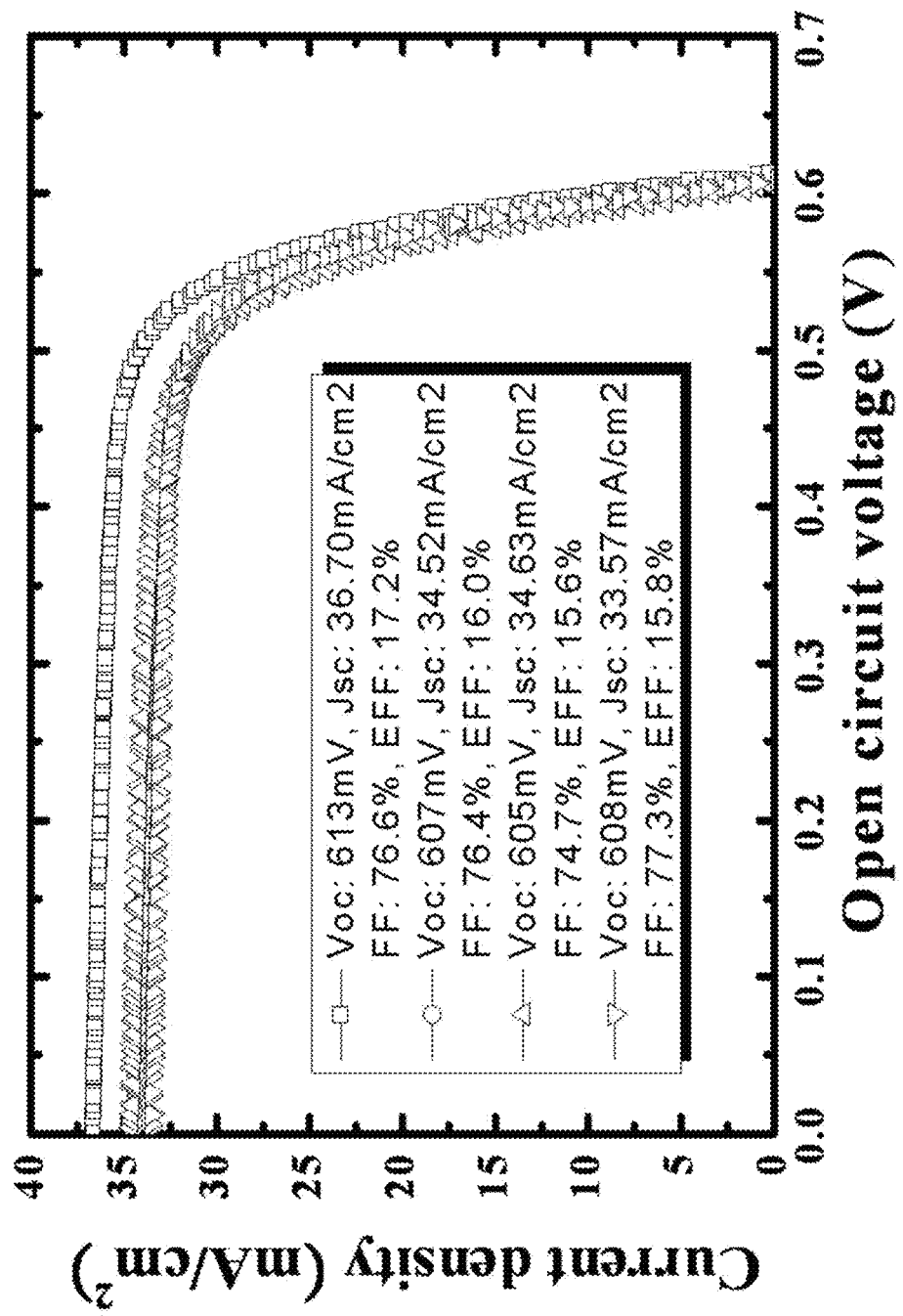
FIG. 6 illustrates the current density depending on the open-circuit voltage using the solar cell according to an embodiment of the present invention.

FIG. 6 illustrates the current density depending on the open-circuit voltage using the solar cell according to an embodiment of the present invention.

As illustrated in FIG. 6, open-circuit voltage (Voc) is a voltage measured by opening the electrode terminal of a solar cell. Short-circuit current (Isc) is a current that flows by shorting the electrode terminal of a solar cell, and is represented in units of amperes (A). When the short-circuit current is divided by the area of the solar cell, a short-circuit current density (Jsc), indicating the current per unit area, is obtained. Also, a fill factor (FF) is a ratio of the product of the maximum output voltage and maximum output current to the product of the open-circuit voltage and short-circuit voltage. The efficiency (EFF) of the solar cell is the ratio of incident light energy and output of the solar cell per unit area, in which the light energy is 100 mW/under standard test conditions, and the output of the solar cell is obtained by multiplying Voc, Jsc, and FF.

Mode for Invention

Hereinafter, a detailed description will be given of examples of the present invention.

EXAMPLE 1

Preparation of Silicon Wafer and Formation of Pyramid Pattern

As monocrystalline silicon, a (100)-oriented silicon wafer was prepared, and a wet etchant comprising 2 wt % of NaOH, 5 wt % of isopropyl alcohol and 93 wt % of DI water was prepared, and the silicon wafer was subjected to wet etching at a high temperature of 80° C.

The wafer was immersed for about 15 min, thus forming a pyramid pattern.

Formation of Nanowires

A solution for forming nanowires on the pyramid pattern on the (100)-oriented silicon wafer was composed of hydrofluoric acid (HF), DI water, H$_2$O$_2$ and AgNO$_3$ by dispersing 10 mmol of AgNO$_3$ in a mixed solution comprising 176 mL of DI water, 22 mL (4.8 mol) of HF, and 2 mL (0.5 mol) of H$_2$O$_2$.

The immersion time for forming nanowires was set to 45 sec, thereby manufacturing a silicon wafer having a complex structure comprising pyramids and nanowires.

EXAMPLES 2 TO 6

Silicon wafers having a complex structure comprising pyramids and nanowires were manufactured in the same manner as in Example 1, with the exception that the immersion time was set to 60 sec (Example 2), 75 sec (Example 3), 90 sec (Example 4), 120 sec (Example 5) and 180 sec (Example 6).

COMPARATIVE EXAMPLE 1

A silicon wafer having only a pyramid pattern was manufactured in the same manner as in Example 1, with the exception that the nanowires were not formed.

Figure 7:
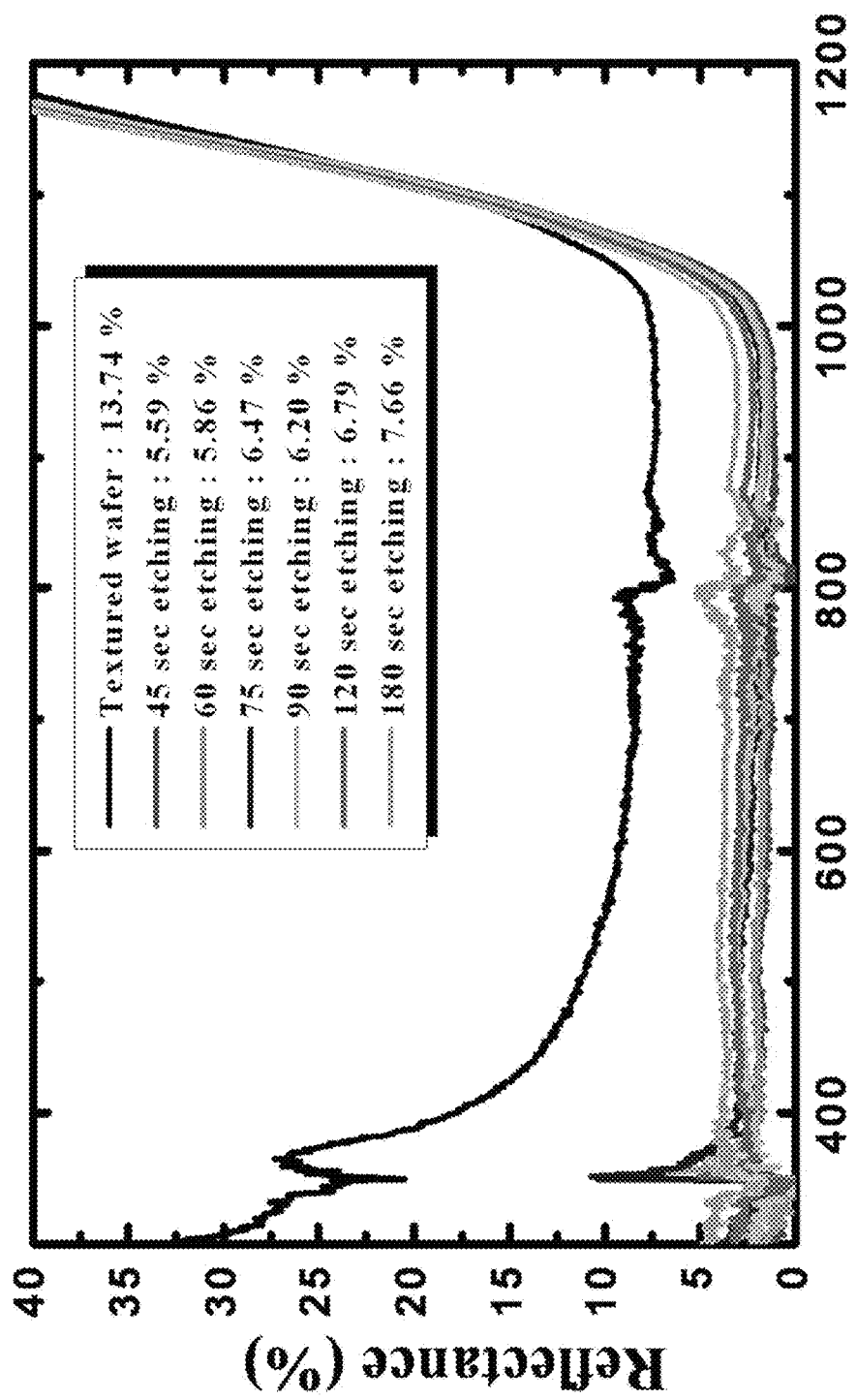
FIG. 7 illustrates the reflectance depending on wavelength in the silicon wafers of Examples 1 to 6 and Comparative Example 1.

FIG. 7 illustrates the reflectance depending on the wavelength of the silicon wafers of Examples 1 to 6 and Comparative Example 1.

As illustrated in FIG. 7, the reflectance values of the silicon wafers of Examples 1 to 6 were much lower than that of Comparative Example 1 in the wavelength range of 1000 nm or less.

EXAMPLE 7

Preparation of Silicon Wafer and Formation of Pyramid Pattern

As monocrystalline silicon, a (100)-oriented silicon wafer was prepared, and a wet etchant comprising 2 wt % of NaOH, 5 wt % of isopropyl alcohol and 93 wt % of DI water was prepared, and the silicon wafer was subjected to wet etching at a high temperature of 80° C.

The wafer was immersed for about 15 min, thus forming a pyramid pattern.

Formation of Nanowires

A solution for forming nanowires on the pyramid pattern on the (100)-oriented silicon wafer was composed of hydrofluoric acid (HF), DI water, H$_2$O$_2$ and AgNO$_3$ by dispersing 10 mmol of AgNO$_3$ in a mixed solution comprising 176 mL of DI water, 22 mL (4.8 mol) of HF, and 2 mL (0.5 mol) of H$_2$O$_2$.

The immersion time for forming nanowires was set to 45 sec, thereby manufacturing a silicon wafer having a complex structure comprising pyramids and nanowires.

Doping with POCl$_3$

The sheet resistance formed upon doping with POCl$_3$ was 50 Ω/sq, and the doping temperature was set to 860° C.

EXAMPLES 8 TO 10

Silicon wafers having a complex structure were manufactured in the same manner as in Example 7, with the exception that the immersion time for forming nanowires was set to 60 sec (Example 8), 75 sec (Example 9), and 90 sec (Example 10).

COMPARATIVE EXAMPLE 2

A pyramid pattern was formed in the same manner as in Example 7, without forming nanowires, after which laser doping was performed, in lieu of doping with POCl$_3$, thus fabricating a silicon wafer.

The reflectance values of the silicon wafers of Examples 7 to 10 and Comparative Example 2 were measured in the wavelength range of 700 nm, 800 nm, 900 nm, and 1000 nm. The results are summarized in Table 1 below.

TABLE 1

| | Reflectance at wavelength (%) | | | |
| --- | --- | --- | --- | --- |
| | 700 nm | 800 nm | 900 nm | 1000 nm |
| Ex. 7 | 3.5 | 3.6 | 3.7 | 3.5 |
| Ex. 8 | 3.8 | 4.0 | 3.9 | 4.0 |

TABLE 1-continued

| | Reflectance at wavelength (%) | | | |
| --- | --- | --- | --- | --- |
| | 700 nm | 800 nm | 900 nm | 1000 nm |
| Ex. 9 | 4.2 | 4.3 | 4.1 | 3.9 |
| Ex. 10 | 4.6 | 4.5 | 4.4 | 4.5 |
| C. Ex. 2 | 10.3 | 9.8 | 10.1 | 10.4 |

As for the silicon wafers of Examples 7 to 10 and Comparative Example 2, the reflectance values of the silicon wafers of Examples 7 to 10 were less than 5% at each wavelength, and the reflectance of Comparative Example 2 exceeded 9%, and thus there was a significant difference in reflectance.

The efficiency of the solar cell fabricated under the conditions of Example 7 was about 17.2%, as measured using IQE.

The use of the silicon wafer having a complex structure of pyramids and nanowires according to the present invention is effective at fabricating a high-efficiency solar cell.

As mentioned hereinbefore, while the preferred embodiments of the present invention have been disclosed herein and in the drawings, those skilled in the art will appreciate that various modifications, additions and substitutions are possible, without departing from the scope and spirit of the invention as disclosed in the accompanying claims.

The invention claimed is:

1. A method of fabricating a silicon wafer having a complex structure, comprising:
   preparing an oriented silicon wafer;
   forming a pyramid pattern on a surface of the silicon wafer through wet etching; and
   forming nanowires by oxidizing the surface of the silicon wafer having the pyramid pattern formed through wet etching.

2. The method of claim 1, further comprising doping the silicon wafer with $POCl_3$, after the forming the nanowires.

3. The method of claim 1, wherein the wet etching is performed at 70 to 80° C. using an etchant comprising 1 to 3 wt % of NaOH, 4 to 8 wt % of an organic solvent, and 90 to 95 wt % of DI water.

4. The method of claim 3, wherein the organic solvent comprises at least one selected from the group consisting of isopropyl alcohol, ethyl alcohol, methyl alcohol, and acetone.

5. The method of claim 1, wherein the nanowires are formed on the pyramid pattern through oxidative etching by immersing the silicon wafer having the pyramid pattern in a solution comprising hydrofluoric acid (HF), DI water, hydrogen peroxide ($H_2O_2$) and $AgNO_3$, in which a mixing ratio of DI water to HF is a volume ratio of 8:1 to 10:1, a mixing ratio of hydrogen peroxide ($H_2O_2$) to HF is a molar ratio of 1:6 to 1:10, and a mixing ratio of $AgNO_3$ to HF is a molar ratio of 1:300 to 1:500.

6. The method of claim 5, wherein the immersing is performed for a period of time ranging from 45 to 90 sec.

7. The method of claim 1, wherein the wet etching is carried out through the following scheme (1):

$$Si + 4OH^- + 4H^+ \rightarrow Si(OH)_4 + 2H_2 \quad (1).$$

8. The method of claim 1, wherein the wet etching is performed for 13 to 17 minutes.

* * * * *